United States Patent
Davison et al.

(10) Patent No.: US 7,183,140 B2
(45) Date of Patent: Feb. 27, 2007

(54) INJECTION MOLDED METAL BONDING TRAY FOR INTEGRATED CIRCUIT DEVICE FABRICATION

(75) Inventors: Peter A. Davison, Puyallup, WA (US); Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/984,042

(22) Filed: Nov. 8, 2004

(65) Prior Publication Data

US 2006/0099788 A1    May 11, 2006

(51) Int. Cl.
*H01L 21/00* (2006.01)
*G02B 6/00* (2006.01)

(52) U.S. Cl. ........... 438/122; 385/135; 257/E23.18; 257/E23.194

(58) Field of Classification Search .......... 438/122; 385/135, 134, 136; 257/E23.18, E23.192, 257/E23.194
See application file for complete search history.

(56) References Cited

U.S. PATENT DOCUMENTS

| | | | |
|---|---|---|---|
| 5,749,510 A * | 5/1998 | Eifuku ............ | 257/E21.505 |
| 6,436,223 B1 * | 8/2002 | Edwards et al. ..... | 156/288 |
| 6,893,901 B2 * | 5/2005 | Madrid ............. | 438/122 |
| 6,901,201 B2 * | 5/2005 | Gurusamy et al. .... | 385/135 |

OTHER PUBLICATIONS

Forecast Product Development, "Magnesium AZ91D", *Material Specifications*, [online], 2003, [Retrieved on Aug. 9, 2004], retrieved from the Internet at <URL: http://www.forecast-3d.com/materials/cast_magn.html>.
Intel Corporation, "Assembly with Intel Components: Rework Practices", *Manufacturing Advantage Tips*, [online], [Retrieved on Aug. 10, 2004], retrieved from the Internet at <URL: http://www.intel.com/design/Quality/COMPONENT/rework_uBGA.htm>.
Intel Corporation, "Intel Packaging Information", *Packaging Databook*, [online], [Retrieved on Aug. 10, 2004], retrieved from the Internet at <URL: http://www.intel.com/design/packtech/packbook.htm>.
Intel Corporation, "Intel Processor Manufacturing & Shipping: Thermoformed Tray Use", *Manufacturing Advantage Service: Manufacturing Enabling*, 2003, pp. 1-27.
Intel Corporation, "Intel Wireless Communications and Computing Package User's Guide", Version 1.2, May 2004.
Intel Corporation, "Plastic Ball Grid Array (PBGA) Packaging". *1998 Packaging Databook*, 14-1 thru 14-26.

(Continued)

*Primary Examiner*—Walter Lindsay, Jr.
(74) *Attorney, Agent, or Firm*—William K. Konrad; Konrad, Raynes, & Victor LLP (57) ABSTRACT

An injection molded metal bonding tray may be utilized in the fabrication of integrated circuit devices. In one embodiment, a substrate of an integrated circuit device is placed in a pocket of an injection molded metal bonding tray. A plurality of conductors is placed on the substrate and the conductors are bonded to the substrate in an infrared reflow oven, for example. Other embodiments are described and claimed.

13 Claims, 6 Drawing Sheets

OTHER PUBLICATIONS

Kurtus, R., "Triboelectric Series of Materials Causing Static Electricity", [online], revised May 29, 2004, [Retrieved on Aug. 9, 2004], retrieved from the Internet at <URL: http://www.school-for-champions.com/science/static_materials.htm>.

Muggy Weld, "Melting Points of Metals", [online], [Retrieved on Aug. 9, 2004], retrieved from the the Internet at <URL: http://www.muggyweld.com/melting.html>.

PCC-Advanced Forming Technology, "ThixoForming", [online], [Retrieved on Aug. 10, 2004], retrieved from the Internet at <URL: http://www.pcc-aft.com/tech/thixo/thixo.html>.

Saporito Finishing Co., "Dow 7- Dichromate, Chemical Dip Conversion Coating", [online], [Retrieved on Sep. 29, 2004], retrieved from the Internet at <URL: http://www.saporitofinishing.com/dow7.asp>.

Schafer, S., "Solder Flip Chip Application", *Semiconductor Equipment Corporation Application Bulletin,* [online], Jun. 6, 2000, [Retrieved on Aug. 10, 2004], retrieved from the Internet at <URL: http://www.semicorp.com/Articles/Solder%20flip%20chip%20app.htm>.

THIXOMAT, "Composite Metal/Plastic Molding Technology", [online], [Retrieved on Aug. 10, 2004], retrieved from the Internet at <URL: http://www.thixomat.com/press_ct.htm>.

WCSSCIENCE.COM, "Thixotropic Materials", [online], [Retrieved on Aug. 11, 2004], retrieved from the Internet at <URL: http://www.wcsscience.com/thixotropic/materials.html>.

* cited by examiner

FIG. 5

INJECTION MOLDED METAL BONDING TRAY FOR INTEGRATED CIRCUIT DEVICE FABRICATION

BACKGROUND

Integrated circuit devices typically include various active and passive circuit elements which have been integrated into or onto a substrate of semiconductor material, often referred to as a die. The die may, in turn, be utilized in a package, which often includes a ceramic or plastic substrate supporting the die although other materials may be used. These packages are usually attached to a printed circuit board, often by conductors arranged on the exterior of the package. In this manner, an electronic system can be assembled by connecting various integrated circuit devices to a printed circuit board. In some applications, a die may be utilized in a system without a package substrate supporting the die.

Figure 1:
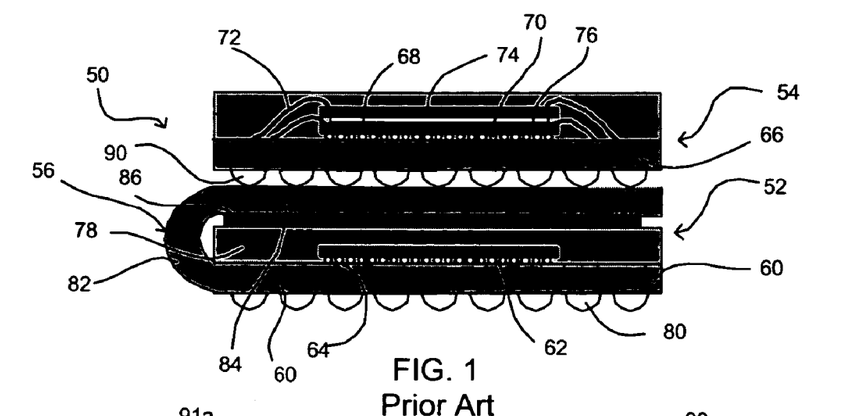
FIG. 1 schematically illustrates a prior art integrated circuit device which includes a folded substrate connecting integrated circuit packages in a package-to-package stack.

To increase space utilization, two or more integrated circuit dies may be attached to a printed circuit board in a stacked arrangement. The dies may be interconnected in a die-to-die stacked arrangement to form a package. Alternatively, each die may be placed in a package and the two packages may be stacked in a package-to-package arrangement. FIG. 1 shows an exploded view of one such package-to-package stack type integrated circuit device which is indicated generally at 50. The device 50 includes a first integrated circuit package 52, and a second integrated circuit package 54 which are physically and electrically connected together using a foldable, flexible substrate 56 of the package 52. In addition to package to package interconnections, folded substrates may be used to provide die-to-die or die-to-package substrate interconnections.

The foldable substrate 56 includes a first substrate interconnect area 60 on which an integrated circuit die 62 is mechanically and electrically connected by a plurality of solder bumps 64. Similarly, the integrated circuit package 54 includes a package substrate 66 to which an integrated circuit die 68 is mechanically and electrically connected by a plurality of solder bumps 70. Other electrical connectors including wires 72 may be used in place of or in addition to the solder bumps 64, 70 to connect the dies to the substrates.

The package 54 includes a third die 74 stacked on the die 68 with a spacer layer 76 therebetween. Additional wires 72 connect the die 74 to the package substrate 66. The package substrates 56, 66 may have both internal and exterior conductors which are electrically connected to the solder bumps 64, 70, wires 72 or to contact pads on the dies 62, 68, 74.

The dies 62, 68 and 74 may be encapsulated in polymers such as an epoxy layer 78 depicted for the die 64. The inputs and outputs of the stack 50 may be electrically connected to a printed circuit board using connection pins, solder bumps or other connection terminals represented at 80 extending from the substrate area 60 of the foldable substrate 56.

The substrate 56 includes a foldable, flexible area 82 which permits a second substrate interconnect area 84 of the substrate 56 to be folded over and attached to the top of the encapsulation layer 78 using a layer 86 of adhesive. The substrate 56 has flexible conductor traces deposited on the foldable area 82 which electrically connect the substrate interconnect area 84 to the substrate interconnect area 60. The inputs and outputs of the package 54 may be mechanically and electrically connected to the substrate area 84 of the foldable substrate 56 using appropriate connection terminals represented at 90 extending from the substrate 66 of the package 54.

In addition to folded substrates, integrated circuits may be stacked with interposers. Other integrated circuit stacks may be formed without folded substrates or interposers.

Figure 2:
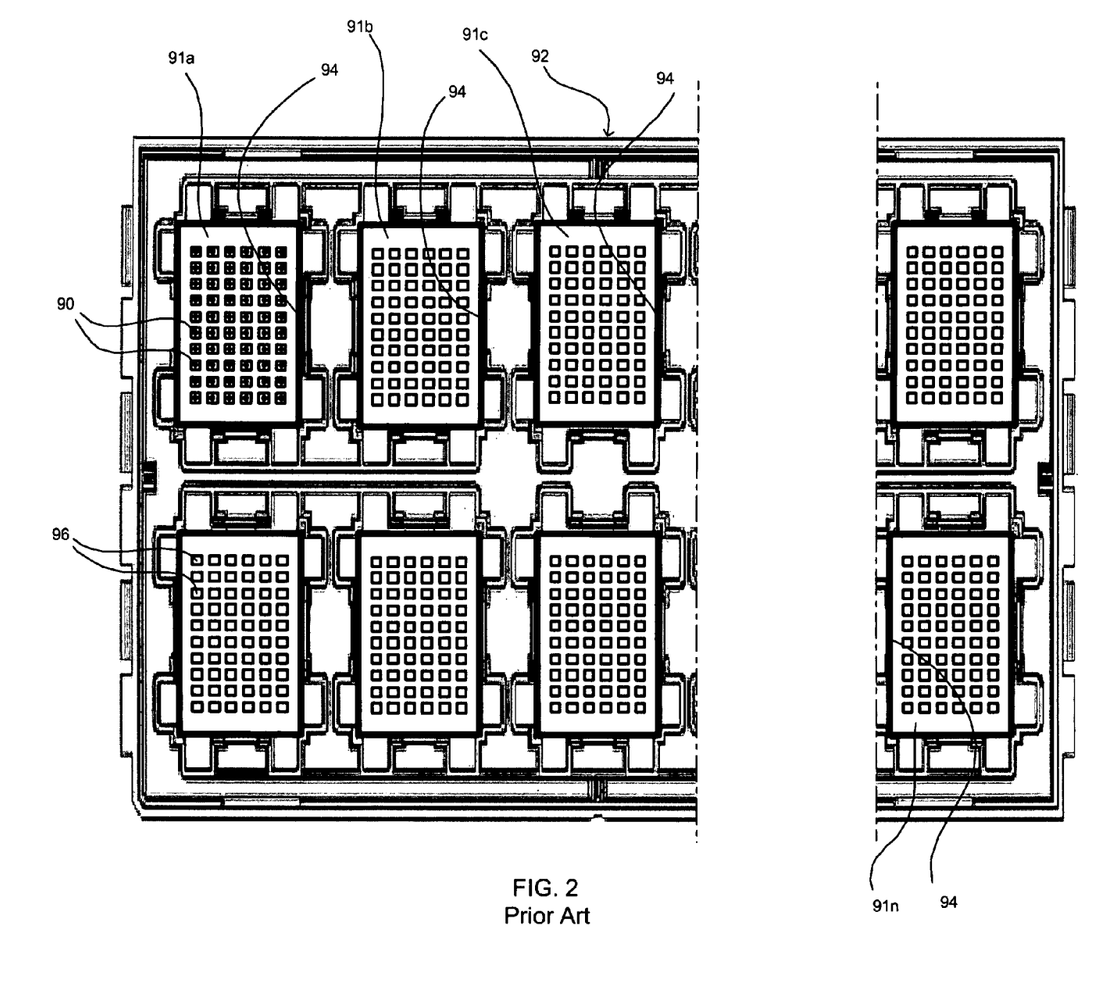
FIG. 2 is a top schematic view of a plurality of substrates held in a prior art bonding tray.

FIG. 2 illustrates a known technique for bonding connection terminals or other conductors to a substrate which may be a package substrate, a semiconductor substrate or other substrate utilized in integrated circuits and integrated circuit packaging. In this example, several substrates 91a, 91b . . . 91n are placed into a bonding tray 92 which is typically formed of injection molded plastic. For example, the bonding tray 92 may be formed of thermoplastic polyimide with a high concentration of carbon fiber and glass fiber. The bonding tray 92 typically has formed within it a plurality of pockets 94, each of which receives an individual substrate 91a, 91b . . . 91n.

Each pocket 94 relatively precisely positions the substrate 91a, 91b . . . 91n relative to the bonding tray 92. In this example, a plurality of solder balls 90 (FIGS. 2, 2a) are positioned on corresponding lands 96 of each substrate 91a, 91b . . . 91n in a ball grid array. The conductors may be placed on the lands 96 of the substrates 91a, 91b . . . 91n manually or using automated equipment. Often, the lands 96 are coated with a suitable flux material prior to depositing the solder balls 90 on to the lands 96.

Figure 2A:
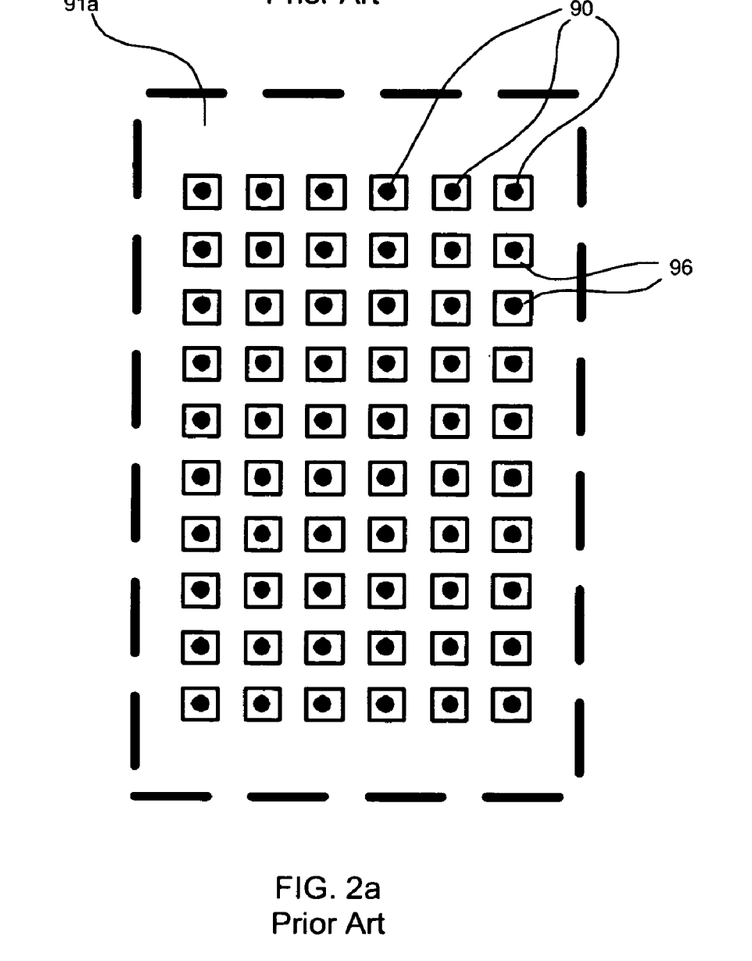
FIG. 2a is a top schematic view of conductor balls placed on lands of a substrate held by the bonding tray of FIG. 2.

The solder balls 90 may be bonded to the lands 96 of the associated substrate 91a, 91b . . . 91n by the application of sufficient heat to cause the solder of the balls 90 to flow. Such heat is typically applied by placing a bonding tray 94 containing the substrates 91a, 91b . . . 91n with solder balls 90 in an oven. One such oven is an infrared solder reflow oven which is operated at a temperature sufficient to bond the balls 90 to the lands 96 of the associated substrate 91a, 91b . . . 91n. In this manner, a complete or partial integrated circuit device may be formed.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 3:
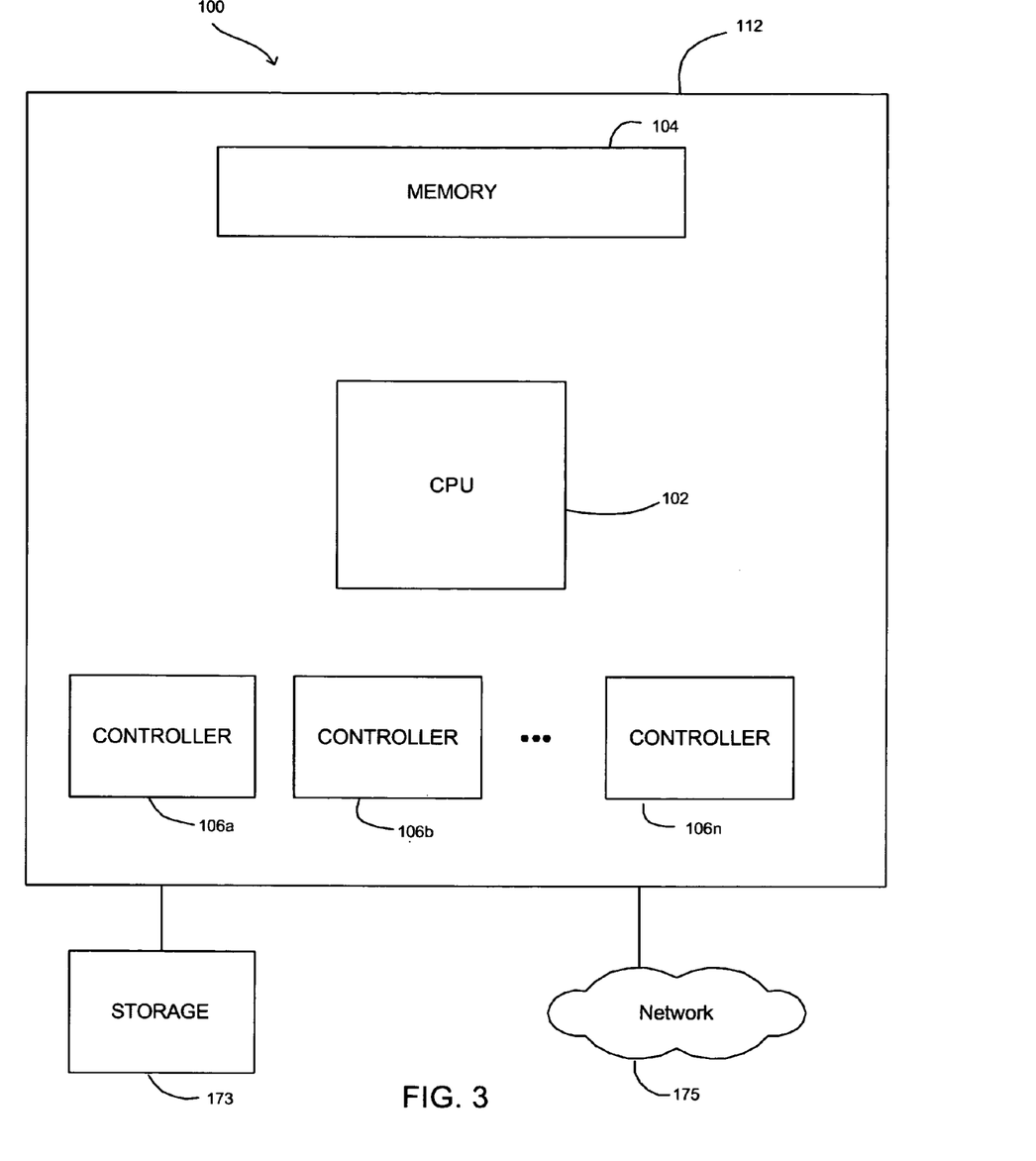
FIG. 3 illustrates one embodiment of a computing environment in which aspects of the description provided herein are embodied.

FIG. 3 illustrates a computing environment in which aspects of described embodiments may be embodied. A computer system 100 includes one or more central processing units (CPU) 102 (only one is shown), a memory 104 and a plurality of controllers 106a, 106b . . . 106n. Each of the CPU 102, and controllers 106a, 106b . . . 106n include one or more electronic devices. Once such electronic device is represented by an integrated circuit device 110 (FIG. 4) which is electrically and mechanically coupled to a printed circuit board 112. The device 110 of this embodiment includes a package-to-package stack comprising a first integrated circuit package 114, and a second integrated circuit package 116 which are mechanically and electrically connected using both a folded substrate 118.

Figure 4:
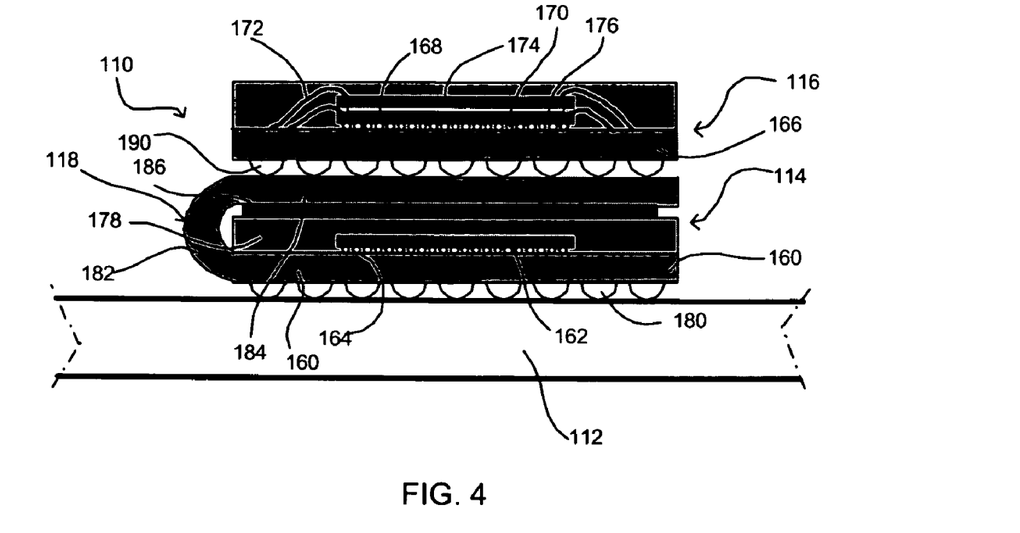
FIG. 4 schematically illustrates an example of an integrated circuit device having conductors bonded using the bonding tray of FIG. 4.

The folded substrate 118 includes a first substrate interconnect area 160 on which an integrated circuit die 162 is mechanically and electrically connected by a plurality of solder bumps 164. Similarly, the integrated circuit package 116 includes a package substrate 166 to which an integrated circuit die 168 is mechanically and electrically connected by a plurality of solder bumps 170.

In some devices, a lead-free solder may be used to bond various components together. Such lead-free solders may have a relatively high reflow temperature. As explained in greater detail below, in fabricating the device 110, a substrate of the device 110 may be placed in a pocket of an injection molded metal tray such as the bonding tray 171 of FIG. 5 to bond a plurality of conductors to the substrate. In one embodiment, the bonding tray 171 may have a relatively high glass transition temperature to resist warpage at high process temperatures. It is appreciated that in other applications, additional or different features may be utilized.

The package 116 includes a third die 174 stacked on the die 168 with a spacer layer 176 therebetween. Additional wires 172 connect the die 174 to the package substrate 166. The package substrates 118, 166 may have both internal and exterior conductors which are electrically connected to the solder bumps 164, 170, wires 172 or to contact pads on the dies 162, 168, 174.

The dies 162, 168 and 174 may be encapsulated in polymers such as an epoxy layer 178 depicted for the die 164. The inputs and outputs of the stack 110 may be electrically connected to a printed circuit board 112 using connection pins, solder bumps or other connection terminals represented at 180 extending from the substrate area 160 of the foldable substrate 118.

The substrate 118 includes a foldable, flexible area 182 which permits a second substrate interconnect area 184 of the substrate 118 to be folded over and attached to the top of the encapsulation layer 178 using a layer 186 of adhesive. The substrate 118 has flexible conductor traces deposited on the foldable area 182 which electrically connect the substrate interconnect area 184 to the substrate interconnect area 160. The inputs and outputs of the package 116 may be mechanically and electrically connected to the substrate area 184 of the foldable substrate 118 using appropriate connection terminals represented at 190 extending from the substrate 166 of the package 114.

In addition to folded substrates, integrated circuits may be stacked with interposers. Other integrated circuit stacks may be formed without folded substrates or interposers. Other electrical connectors including wires 172 may be used in place of or in addition to the solder bumps 164, 170 to connect the dies to the substrates. Other integrated circuit devices may be formed without package substrates such as the substrate 166.

The printed circuit board 112 may be a single layer or multi-layered motherboard which has a plurality of conductive lines that provide communication between the circuits in the device 110 and other components mounted to the board 112. Alternatively, one or more of the CPU 102, memory 104 and controllers 106a, 106b . . . 106n may be disposed on other cards such as daughter cards or expansion cards.

An operating system and various applications execute on the CPU 102 and reside in the memory 104. The content residing in memory 104 may be cached in accordance with suitable caching techniques. Programs and data in memory 104 may be swapped into storage 173 as part of memory management operations. The computer system 100 may comprise any suitable computing device, such as a mainframe, server, personal computer, workstation, laptop, handheld computer, telephony device, network appliance, virtualization device, storage controller, network controller, etc. Any suitable CPU 102 and operating system may be used.

The controllers 106a, 106b . . . 106n may include a system controller, peripheral controller, memory controller, hub controller, I/O bus controller, video controller, network controller, storage controller, etc. For example, a storage controller can control the reading of data from and the writing of data to a storage 173 in accordance with a storage protocol layer. The storage protocol of the layer may be any suitable storage protocols. Data being written to or read from the storage 106 may be cached in accordance with suitable caching techniques.

A network controller can include one or more protocol layers to send and receive network packets to and from remote devices over a network 175. The network 175 may comprise a Local Area Network (LAN), the Internet, a Wide Area Network (WAN), Storage Area Network (SAN), or any other suitable network. Embodiments may be configured to transmit data over a wireless network or connection such as a cellular phone network or a Wireless Fidelity (Wi-Fi) Ethernet network. In certain embodiments, the network controller and various protocol layers may employ the Ethernet protocol over unshielded twisted pair cable, token ring protocol, Fibre Channel protocol, etc., or any other suitable network communication protocol.

Figure 6:
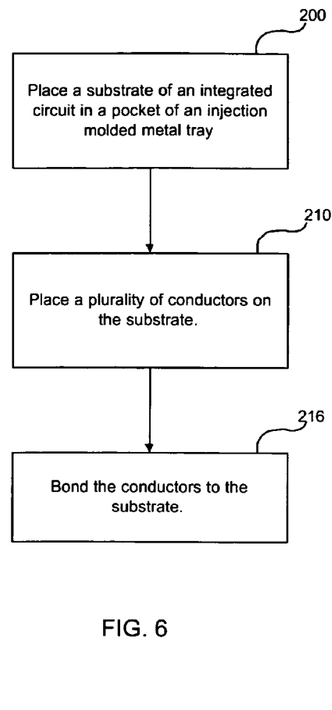
FIG. 6 illustrates one example of operations to bond conductors on a substrate of an integrated circuit device, in accordance with one embodiment of the present description.
Figure 7A:
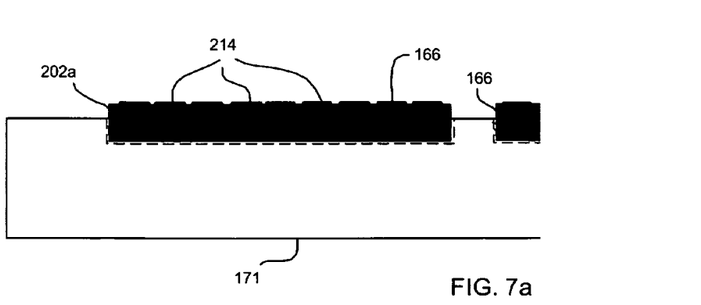
FIGS. 7a–c are schematic cross-sectional views of operations to bond conductors on a substrate of an integrated circuit device, in accordance with one embodiment of the present description.

FIGS. 6 and 7a–7c show examples of operations in fabricating the device 110 including bonding conductors to a substrate of the device 110. In one operation, a substrate of an integrated circuit device is placed (block 200) in a pocket of an injection molded metal tray. FIG. 7a shows one example in a schematic, cross-sectional diagram, of a substrate 166 being placed in a pocket 202a of the bonding tray 171. In the illustrated embodiment, the bonding tray 171 is formed of a magnesium-aluminum alloy such as AZ91D, for example. It is appreciated that other metals and metal alloys may be utilized as well. For example, the alloys AM60 or AE42 may be used. As another example, AJ52 is a suitable alloy which is a relatively low stress grade which can provide a degree of flatness appropriate for some applications. For example, in some applications, a flatness within 0.030 inches may be achieved.

Figure 5:
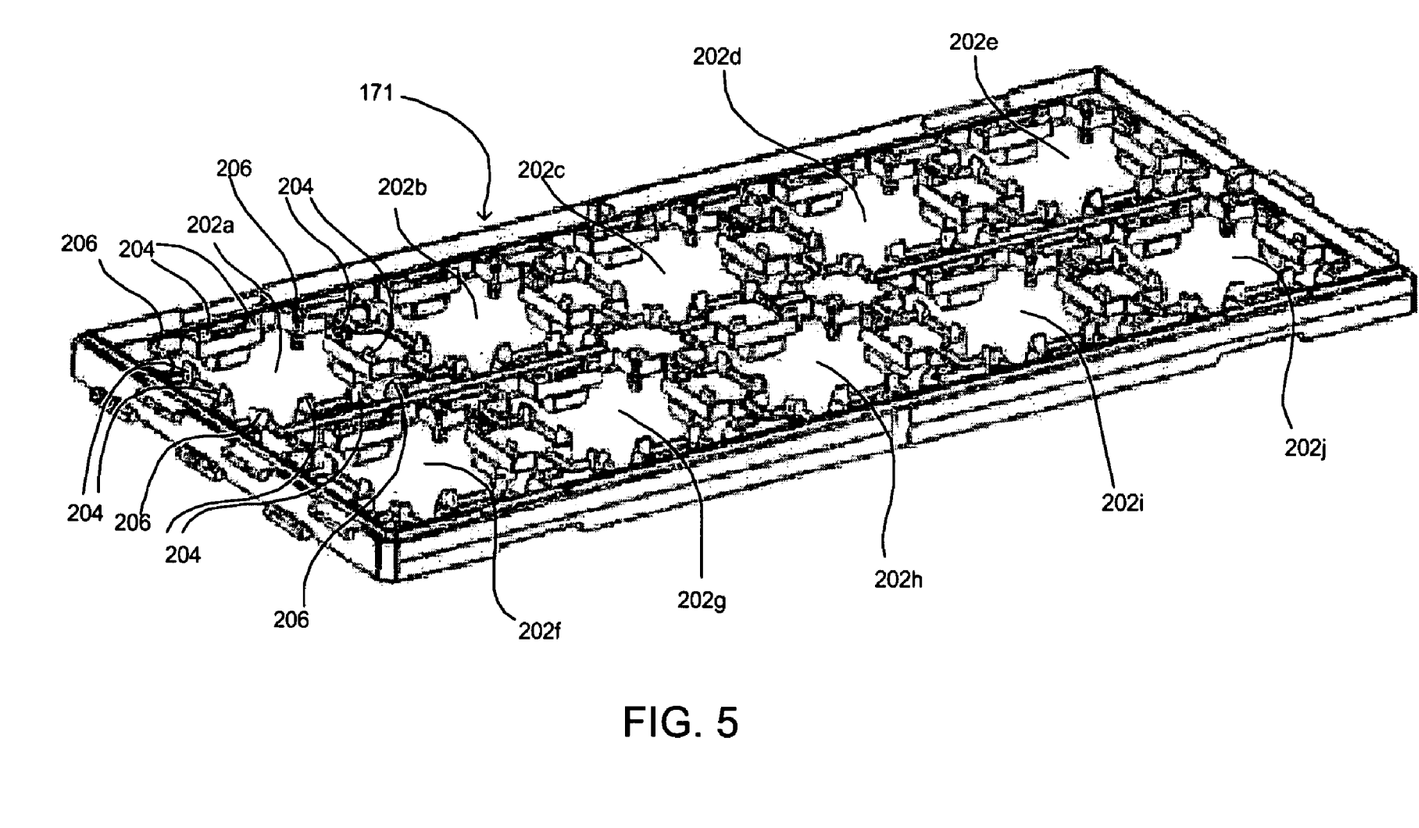
FIG. 5 is a schematic perspective view of an injection molded metal bonding tray in accordance with one embodiment of the description provided herein.

In the illustrated embodiment, the bonding tray 171 is formed in a metal injection molding process of a thixotropic metal alloy. Magnesium-aluminum alloys exhibit thixotropic properties when heated near their melting point and shear forces are applied. As used herein, thixotropic refers to a "semi-solid state"—solid particles in a liquid matrix. When the thixotropic condition occurs, the material may have viscous or plastic-like flow properties. It is believed that a magnesium-aluminum alloy such as AZ91D, for example, is thixotropic. It is appreciated that other thixotropic metal alloys and other metal injection molding processes may be utilized as well.

Following molding, the tray 171 may be trimmed and abraded. For example, the tray 171 may be trimmed with a precision trim die and treated in a vibratory bowl with abrasive media for "vibe milling" to deburr and remove oxides from the tray surface.

In the illustrated embodiment, the bonding tray 171 has ten pockets 202a, 202b . . . 202j (FIG. 5), each of which is formed by a plurality of upstanding members 204 and 206 which engage the edge of the substrate to precisely position the substrate within the associated pocket 202a, 202b . . . 202j. The injection molded metal bonding tray 171 may have the same shape as the plastic bonding tray 92 (FIG. 2). It is appreciated, however, that the number of pockets and the shape and construction of each pocket may vary, depending upon the particular application. It is further appreciated that an injection molded metal tool for use in fabricating integrated circuit devices in accordance with the present description may have a variety of shapes and uses.

Figure 7B:
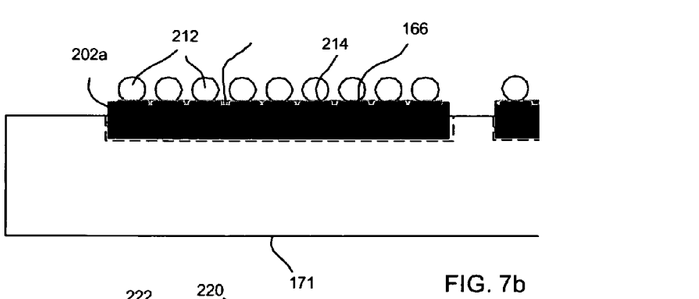

In another operation, a plurality of conductors may be placed (block 210, FIG. 6) on the substrate. FIG. 7b shows one example in a schematic, cross-sectional diagram, of a plurality of generally ball-shaped conductors 190 being placed on conductive lands 214 of the substrate 166. In the illustrated embodiment, the conductors 190 are formed of a lead-free solder. It is appreciated that the conductors 190 may be formed of other conductive materials and may be formed into other shapes including pins, wires etc.

The conductors 190 may be placed manually by a human operator or may be placed using automated tools. It is appreciated that a variety of suitable fabrication techniques may be utilized.

Figure 7C:
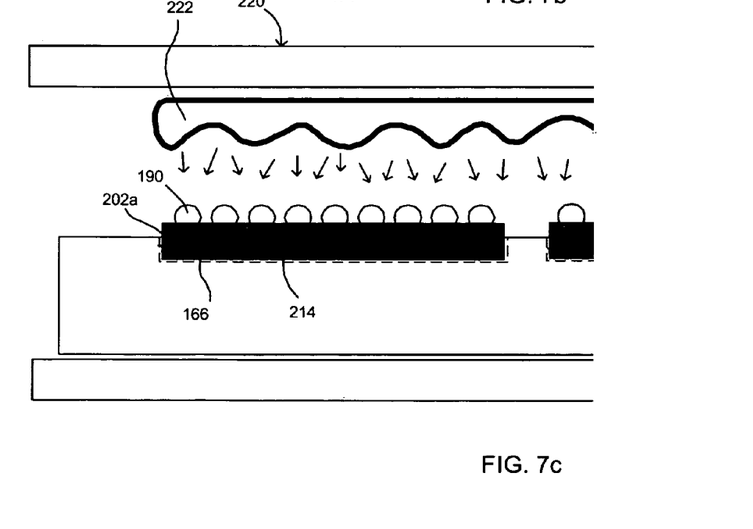

In another operation, the conductors are bonded (block 216) to the substrate. FIG. 7c shows one example in a schematic, cross-sectional diagram, of the conductors 190 being bonded to the lands 214 of the substrate 166. In the illustrated embodiment, the bonding process includes application of heat sufficient heat to cause the solder of the conductors 190 to flow. Such heat may be applied by placing a bonding tray 171 containing the substrates 166 with solder conductors 190 in an oven such as infrared solder reflow oven 220 which includes a suitable heating element 222.

Some conductors such as lead-free solder, for example, have a relatively high bonding or reflow temperature. However, the glass transition temperature of magnesium is generally substantially higher. For example, it is believed that the glass transition temperature of magnesium AZ91D is 468 degrees, Celsius, a temperature substantially higher than the maximum temperature of many ovens. For example, one known infrared solder reflow oven has a maximum temperature of 290 degrees Celsius. Accordingly, a bonding tray 171 of injected molded magnesium-aluminum alloy may readily withstand the temperatures of many suitable reflow ovens. By comparison, a polyimide bonding tray may have a glass transition temperature of approximately 250 degrees Celsius. Thus, a bonding tray 171 of injected molded magnesium-aluminum alloy may have a glass transition temperature significantly in excess of 450 degrees Celsius, or 250 degrees Celsius or the glass transition temperature of many known polyimide bonding trays.

Once the conductors 190 have been bonded to the substrate 166, the bonding tray 171 may be removed from the reflow oven 220 and the substrate 166 with bonded conductors 190 may be removed from the bonding tray 171. The device 110 may then be completed and connected to the printed circuit board 112 as shown in FIG. 4 and described above.

An injection molded metal bonding tray 171 may have other properties which may be appropriate, depending upon the particular application. For example, it is believed that magnesium-aluminum AZ91D alloy is a relatively stiff material having a flexural modulus of 45 GPa. By comparison, a polyimide bonding tray may have a flexural modulus of 10.9 GPa, for example. Thus, a bonding tray 171 of injected molded magnesium-aluminum alloy may have a flexural modulus significantly in excess of 20 GPa or 11 GPa, or the flexural modulus of many known polyimide bonding trays.

In accordance with another aspect, the bonding tray 171 may be coated with a material. For example, in some applications, it may be appropriate to reduce or eliminate the buildup of triboelectric charge. In the illustrated embodiment, the bonding tray 171 may be coated with a material which imparts a total surface resistivity of the bonding tray 171 to be in a range of $10^5$–$10^9$ ohms. It is believed that such a total surface resistivity is sufficiently conductive to inhibit the buildup of triboelectric charge and is also sufficiently resistive to inhibit sudden discharge of triboelectric charge which could damage an integrated circuit carried with the bonding tray 171. In this manner, the surface of the tray 171 may be considered to be "semi-conductive."

In the illustrated embodiment, the outer surface of the bonding tray 171 may be oxidized for a period of 155 seconds, for example, to a depth of 2 microns, for example. Other depths which may be suitable, depending upon the particular application, may include an oxidation depth of 1–3 microns. The process by which the outer surface is oxidized may vary, depending upon the particular application. For example, for a metal bonding tray 171 of injection molded magnesium-aluminum alloy, an anodized coating process such as the commercially available Tagnite 2000 (provided by Technology Applications Group) or the Mag-Oxide anodized coating processes (provided by Luke Engineering) may be suitable. Another coating process is a chemical conversion process such as the commercially available Dow 7 coating (provided by Saporito Finishing). The particular process utilized may vary, depending upon a number of factors including the particular total surface resistivity selected, the depth of the coating selected, and other properties such as the abrasion resistance selected.

In the illustrated embodiment, the substrate 166 held by the bonding tray 171 is a plastic package substrate for a package for an integrated circuit device 110. It is appreciated that the bonding tray 171 may be used to bond conductors to a variety of substrates including other package substrates, semiconductor substrates or any other substrates utilized in integrated circuit devices. For example, a substrate may be formed of an electrically insulative material such as a polyimide or an epoxy such as bismaleimide triazine or High Tg FR-4 (BT). It is appreciated that other types of flexible or inflexible, insulative or conductive materials may be used for a substrate, depending upon the particular application.

In the illustrated embodiment, the conductors 190 of the integrated circuit device 110 are ball-shaped conductors disposed in a ball grid array (BGA. It is appreciated that other types and shapes of conductors such as a pin grid array (PGA) may be used and that the conductors may be arranged in a variety of layouts.

In the illustrated embodiment, the conductors 190 are formed of an electrically conductive material such as a lead-free solder, for example. It is appreciated that other types of conductive materials such as copper, aluminum or gold may be used. In some applications, a nonmetal conductive material may be utilized. The degree of conductivity, and other properties may vary, depending upon the particular application.

In the illustrated embodiment, the conductors 190 are bonded to the lands 214 in a reflow process. It is appreciated that conductors may be joined and bonded to a substrate held by a bonding tray in accordance with the present description using a variety of bonding techniques. An appropriate joining and bonding may be achieved by those skilled in the electronic device packaging or fabrication arts. Also, ovens other than reflow ovens may be utilized.

Additional Embodiment Details

In certain embodiments, an integrated circuit device formed using a bonding tray in accordance with the present description, may be embodied in a computer system which includes a video controller to render information to display on a monitor wherein the computer system may be a desktop, workstation, server, mainframe, laptop, handheld computer, handheld wireless telephone, etc. Alternatively, the devices may be embodied in a computing device that does not include a video controller, such as a switch, router, etc.

The illustrated operations of FIGS. 6 and 7a–7c show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 8:
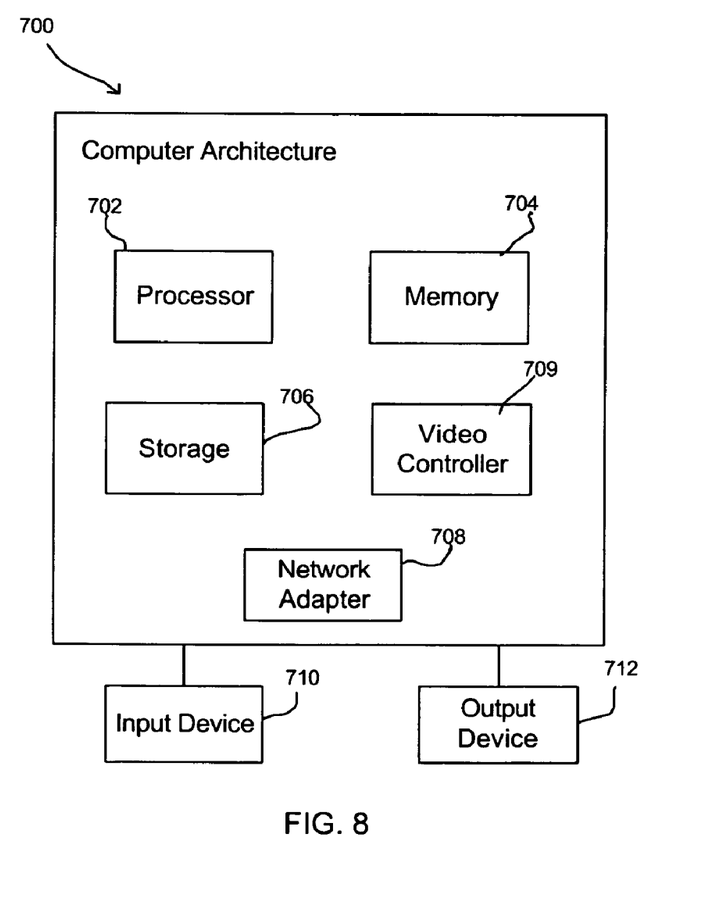
FIG. 8 illustrates an architecture that may be used with the described embodiments.

FIG. 8 illustrates one embodiment of a computer architecture 700 which can utilize components, such the devices shown in FIG. 3. One or more components or devices may utilize a device fabricated using a bonding tray in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, flash memory, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art. The architecture further includes a network adapter 708 to enable communication with a network, such as an Ethernet, a Fibre Channel Arbitrated Loop, cellular telephone, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art. An output device 712 is capable of rendering information transmitted from the processor. 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices fabricated in accordance with the present description may be mounted directly to a card or may utilize a package in accordance with the description provided herein. Thus, device embodiments may be used in computer systems or other systems in which such a device in accordance with the present description is mounted on one or both of a motherboard and an expansion card. Accordingly, in some system embodiments, the system may lack an expansion card, and a device in accordance with the present description may be mounted on a motherboard. In another system embodiment, a device in accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999–2003.

The foregoing description of various embodiments has been presented for the purposes of illustration and explanation. It is not intended to be exhaustive or to limit to the precise form disclosed. Many modifications and variations are possible in light of the above teaching.

What is claimed is:

1. A fabrication tool for use in fabricating an integrated circuit device having a substrate, comprising:
   an injection molded metal bonding tray having an oxide material coating said bonding tray, said bonding tray being adapted to support said substrate in an oven.

2. The fabrication tool of claim 1 wherein said metal is a magnesium-aluminum alloy.

3. The fabrication tool of claim 1 wherein said bonding tray is injection molded using a thixotropic metal alloy.

4. The fabrication tool of claim 1 wherein said bonding tray has a glass transition temperature in excess of 265 degrees C.

5. The fabrication tool of claim 4 wherein said bonding tray has a glass transition temperature in excess of 450 degrees C.

6. The fabrication tool of claim 1 wherein said bonding tray has a total surface resistivity of $10^5$–$10^9$ ohms.

7. The fabrication tool of claim 1 wherein said bonding tray has a flexural modulus in excess of 11 GPa.

8. The fabrication tool of claim 1 wherein said bonding tray has a plurality of pockets, each pocket being adapted to receive and position a substrate within said tray.

9. A system, comprising:
   a reflow oven adapted to heat an integrated circuit device having a substrate; and
   an injection molded metal bonding tray having an oxide material coating said bonding tray, said bonding tray being adapted to support said substrate in said oven.

10. The system of claim 9 wherein said metal is a magnesium-aluminum alloy.

11. The system of claim 9 wherein said bonding tray is injection molded using a thixotropic metal alloy.

12. The system of claim 9 wherein said bonding tray has a glass transition temperature in excess of 265 degrees C.

13. The system of claim 12 wherein said bonding tray has a glass transition temperature in excess of 450 degrees C.

* * * * *